(12) United States Patent
Kubo

(10) Patent No.: US 6,515,932 B1
(45) Date of Patent: Feb. 4, 2003

(54) MEMORY CIRCUIT

(75) Inventor: Kazuaki Kubo, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/548,121

(22) Filed: Apr. 12, 2000

(30) Foreign Application Priority Data

Apr. 13, 1999 (JP) .......................................... 11-105303

(51) Int. Cl.[7] ................................................ G11C 7/00
(52) U.S. Cl. .................................. 365/226; 365/230.06
(58) Field of Search ....................... 365/189.01, 189.09, 365/203, 230.06, 226, 185.23

(56) References Cited

U.S. PATENT DOCUMENTS

| | | | | |
|---|---|---|---|---|
| 5,218,569 A | * | 6/1993 | Banks .................... | 365/189.01 |
| 5,610,869 A | * | 3/1997 | Yoo et al. ............... | 365/189.07 |
| 5,880,622 A | * | 3/1999 | Evertt et al. ................ | 327/535 |
| 6,097,631 A | * | 8/2000 | Guedj ................... | 365/185.05 |
| 6,265,932 B1 | * | 7/2001 | Miyawaki ................... | 327/535 |

* cited by examiner

*Primary Examiner*—A Zarabian
(74) *Attorney, Agent, or Firm*—Adams & Wilks

(57) ABSTRACT

A memory circuit allowing data to be read when a source voltage decreases below the threshold of a selecting transistor comprises a selecting transistor and a series-connected memory transistor, a power source for supplying a source voltage, a voltage detecting circuit for detecting a voltage of the source voltage, a boosting circuit for boosting the source voltage when it has fallen to a value near or below the threshold voltage of the selecting transistor, and a boosted voltage detecting circuit for detecting the boosted voltage and controlling the boosting circuit to boost the source voltage to a value within a range having a lower limit greater than the threshold voltage of the selecting transistor. The boosting circuit generates a boosted voltage that is applied to a word line via high-voltage switch.

22 Claims, 5 Drawing Sheets

MEMORY CIRCUIT

BACKGROUND OF THE INVENTION

1. Field of the Invention

The present invention relates to a memory circuit used for data storage, and more specifically to a memory circuit in which the stored data can be read even when a source voltage decreases.

2. Description of the Related Art

The layout of a main portion of a typical memory circuit is shown in the circuit diagram of FIG. 5. In FIG. 5, an inverter 1 is connected to the gate of a transistor 3 via a switching transistor 2. A memory cell 4 for storing one bit of data is inserted between a power source (not shown) and the ground. The memory cell 4 is comprised of a selective (or selecting) transistor 5 and a memory transistor 6 which are serially connected to each other.

The selective transistor 5 is turned on by applying the gate voltage to the gate (the selective gate) when a word line WL is selected, and is applied with VBL as a bias voltage. A threshold voltage with which the selective transistor 5 is operated is set to 1.5V, for example. The memory transistor 6 is operable to store binary data ("1"/"0") data according to the presence/absence of charged electric charge, the drain of which is connected to a bit line BL.

In this structure, the memory transistor is electrically charged when "0" data is written to the memory cell 4. In this case, when the word line WL is selected, a voltage is applied to the gate of the selective transistor 5 to turn on the selective transistor 5. The memory transistor 6 is then turned on due to the electric charge, thus making a current flow to the bit line BL, and the current is detected to read the "0" data.

On the other hand, if "1" data is written to the memory cell 4, the memory transistor 6 is not charged with electric charge. When the word line WL is selected, a voltage is applied to the gate of the selective transistor 5 to turn on the selective transistor 5. However, no existence of electric charge in the memory transistor 6 does not bring a current flowing to the bit line BL. In this state where there is no flowing current, the "1" data is read out.

In conventional memory circuits, as a source voltage VCC decreases when the data is read, the gate voltage applied to the gate of the selective transistor 5 decreases accordingly. This results in difficulty in flowing the drain current because a difference between the threshold voltage of the selective transistor 5 and the gate voltage of the selective transistor 5 becomes smaller as the source voltage VCC is dropped to, for example, 1.8 V or less.

Hence, in conventional memory circuits, the selective transistor 5 may not be turned on in a normal manner as the source voltage VCC decreases, causing a problem in which the charging state of electric charges in the memory transistor 6 cannot be confirmed and thus data cannot be read from the memory cell 4.

SUMMARY OF THE INVENTION

The present invention has been made from this context, and has an object to provide a memory circuit in which data can be read in a normal manner even when a source voltage decreases.

In order to attain the above object, the present invention provides a memory circuit having a memory cell provided at a cross point of a word line and a bit line, the memory cell comprising a selective transistor turned on when the word line is selected, and a memory transistor connected to the selective transistor for storing "1"/"0" data according to the presence/absence of electric charge, the memory circuit comprising: source voltage detection means for detecting a source voltage; booster means responsive to the detection result of the source voltage detection means to boost the source voltage to apply the boosted voltage to the word line if the source voltage becomes equal to or less than the threshold value of the selective transistor when the "1"/"0" data is read.

The source voltage is detected by the source voltage detection means when the "1"/"0" data stored in the memory transistor is read. When the source voltage becomes equal to or less than the threshold value of the selective transistor, the booster means boosts the source voltage to apply the boosted voltage to the word line. Therefore, since the gate voltage of the selective transistor is sufficiently high relative to the threshold value of the selective transistor when the word line is selected, the selective transistor may not be influenced from a drop of the source voltage and is turned on in a normal manner to read the "1"/"0" data from the memory transistor.

Further, according to the present invention, the above-described booster means boosts the source voltage so that this boosted voltage takes a value ranging from two or more times greater than the threshold voltage of the selective transistor up to the maximum value of the source voltage. In other words, the boosted voltage is controlled to be within a range between two or more times greater than the threshold voltage of the selective transistor and the maximum value or less of the source voltage. This allows the "1"/"0" data to be read from the memory transistor without any influence from a drop of the source voltage. Furthermore, the influence of the stress affected to the gate of the selective transistor by the boosted voltage can be equalized with that in the normal operation of the source voltage.

Still further, the memory circuit according to the present invention comprises boosted voltage detection means for detecting the boosted voltage, wherein the booster means is responsive to the detection results of the boosted voltage detection means to perform the boosting operation so that the boosted voltage is within the above range.

The memory circuit according to the present invention comprises the above-described boosted voltage detection means, employing an intermittent driving control in which the boosting operation is performed by the booster means if the boosted voltage is less than the lower limit of the above range while the boosting operation is stopped if the boosted voltage is over the upper limit of the above range. This prevents any excess boosting operation, thereby reducing the power consumption.

Still further, according to the present invention, the above-described booster means causes a high voltage when the data is written to the memory cell.

The booster means causes a high voltage when the data is written to the memory cell and causes the boosted voltage for the purpose of compensating for a drop of the source voltage during a read operation. The memory circuit according to the present invention employs the features of the conventional write booster means, thus making it possible to achieve relatively easy circuit structure.

DETAILED DESCRIPTION OF THE PREFERRED EMBODIMENT

A preferred embodiment of a memory circuit in accordance with the present invention will now be described in detail with reference to the accompanying drawings.

Figure 1:
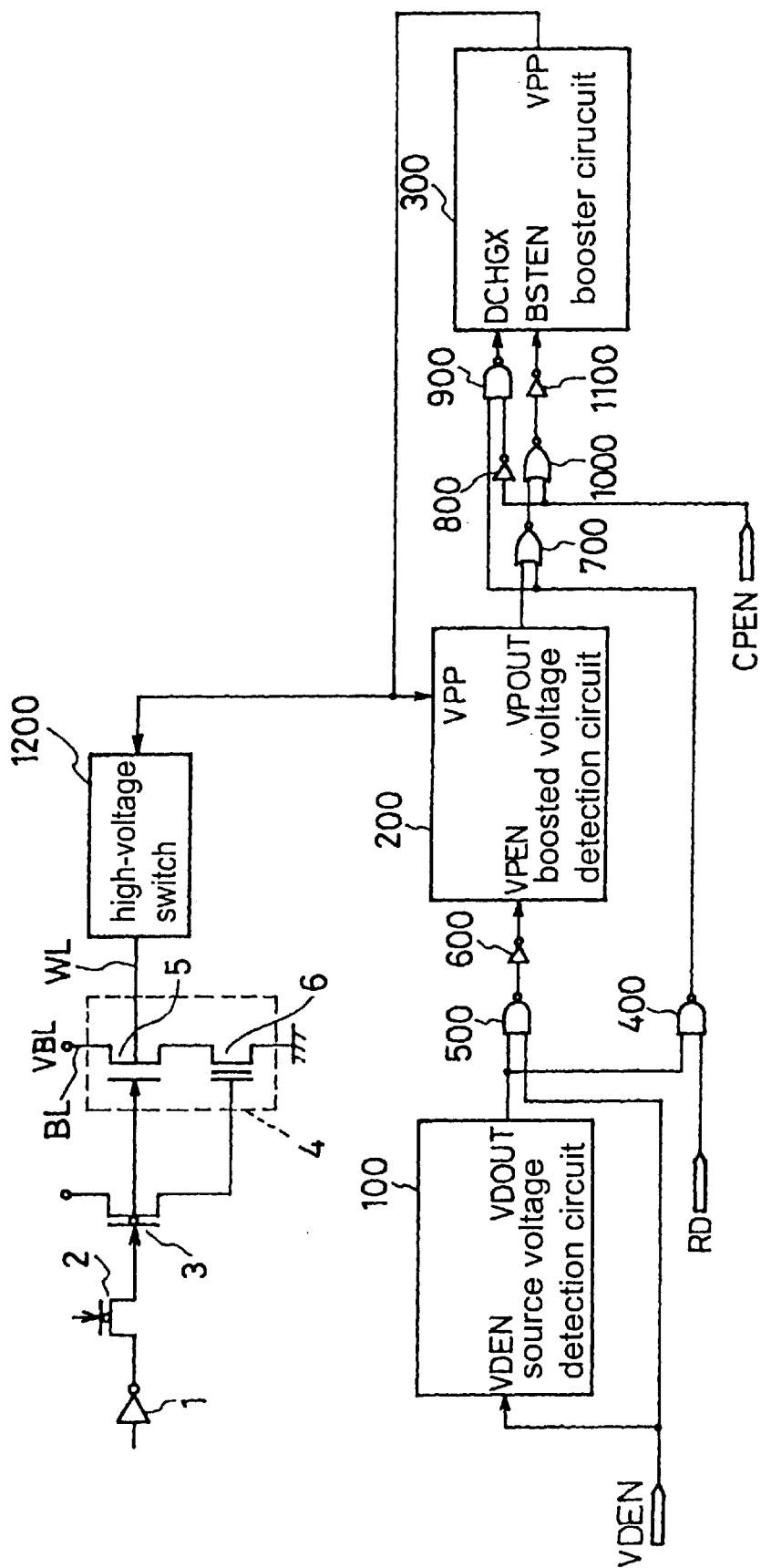
FIG. 1 is a circuit diagram showing the layout of a memory circuit in accordance with an embodiment of the present invention.
Figure 5:
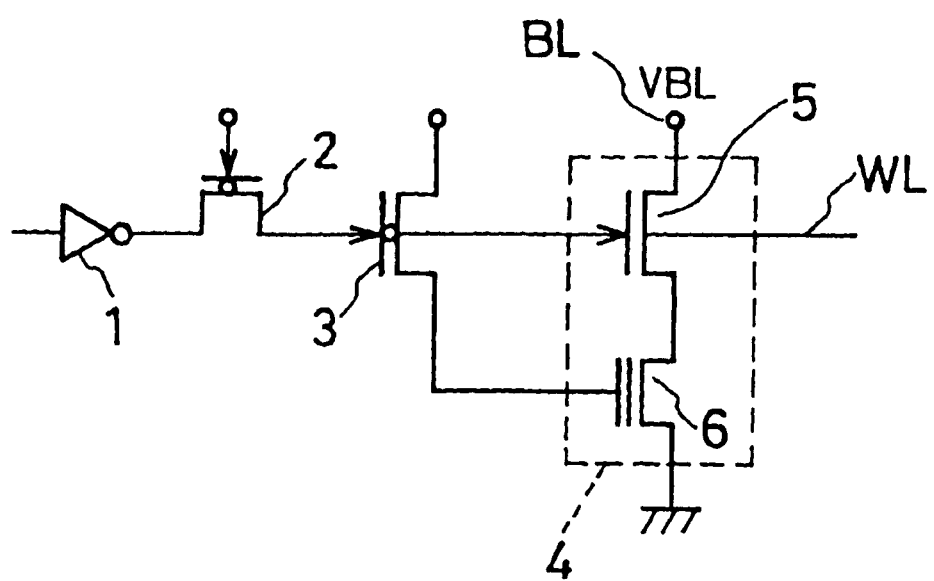
FIG. 5 is a circuit diagram showing the layout of a main portion of a typical memory circuit.

FIG. 1 is a circuit diagram showing the layout of a memory circuit in accordance with an embodiment of the present invention. In FIG. 1, portions corresponding to those in FIG. 5 are designated by the same reference numerals, omitting description thereof. A memory circuit shown in FIG. 1 includes a source voltage detection circuit 100, a boosted voltage detection circuit 200 and a booster circuit 300. The source voltage detection circuit 100 is operable to detect the source voltage VCC of a power source (not shown) for supplying power to the relevant sections in the memory circuit.

The booster circuit 300 is operable to boost the source voltage VCC to generate the boosted voltage VPP when the source voltage Vcc is dropped to the threshold value or less. The boosted voltage detection circuit 200 detects the boosted voltage VPP to control the boosting operation in the booster circuit 300 based on the detection results.

Figure 2:
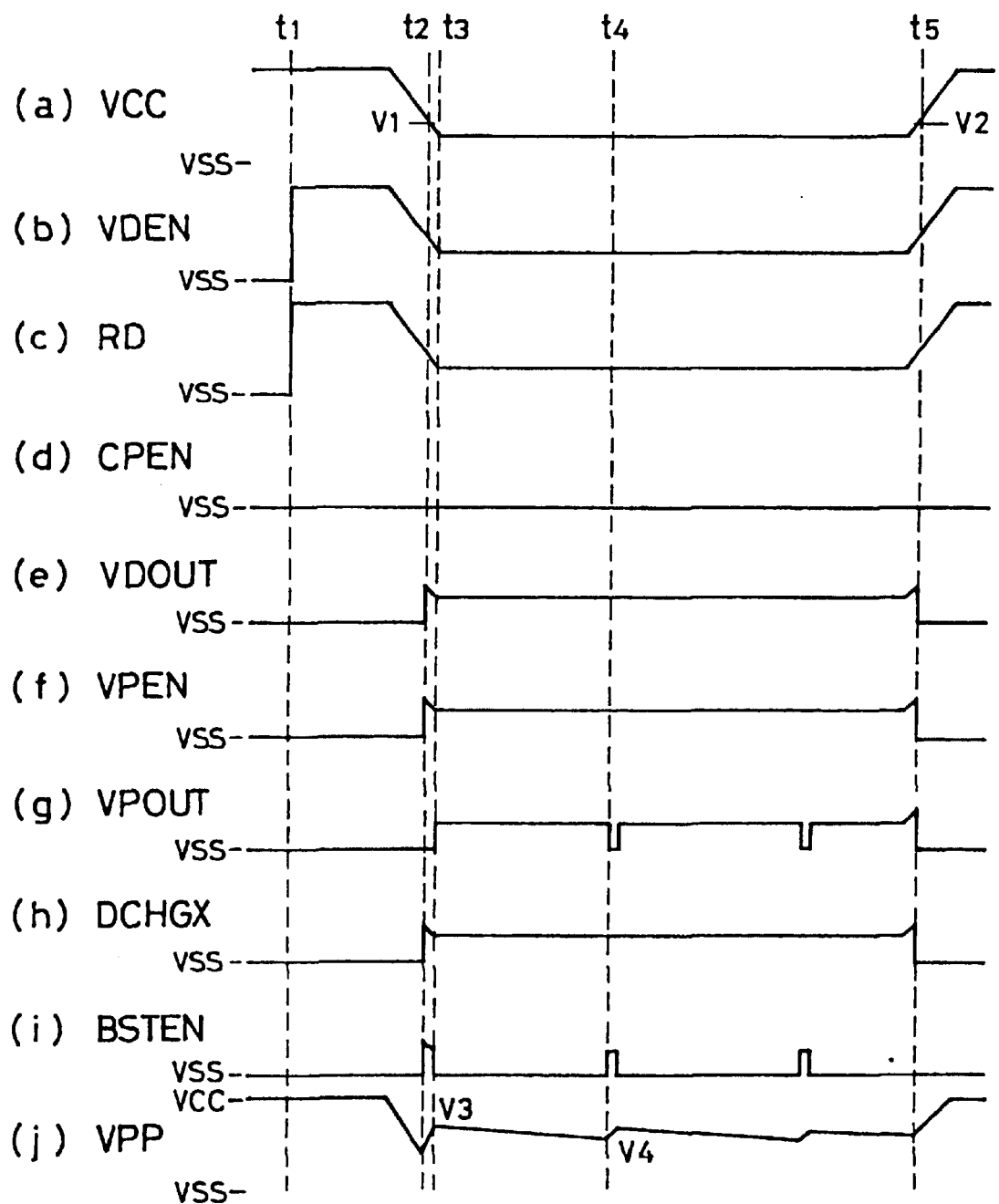
FIG. 2 is a timing chart for explaining the operation of the memory circuit in accordance with the same embodiment of the present invention.

More specifically, the source voltage detection circuit 100 detects whether or not the source voltage VCC is equal to or less than a low voltage threshold value V1 (see (a) of FIG. 2). It is to be noted that the low voltage threshold value V1 is set to a value 1.2 or more times greater than the threshold voltage (=1.5 V) of the selective transistor 5.

The source voltage detection circuit 100 outputs a source voltage drop detection signal VDOUT of "L" level (voltage VSS) indicated by (e) of FIG. 2 when the source voltage VCC is higher than the low voltage threshold value V1 (or a low voltage threshold value V2) as indicated by (a) of FIG. 2, where V2>V1. On the other hand, if the source voltage VCC (see (a) of FIG. 2) is equal to or less than the low voltage threshold value V1, the source voltage detection circuit 100 outputs a source voltage drop detection signal VDOUT of "H" level indicated by (e) of FIG. 2. Further, the source voltage detection circuit 100 is enabled in response to an enable signal VDEN (see (b) of FIG. 2).

The source voltage drop detection signal VDOUT is inputted into one gate of a NAND circuit 500 while the enable signal VDEN is inputted into the other gate of the NAND circuit 500. An output signal of the NAND circuit 500 is inverted by an inverter 600 and is then inputted as a booted voltage detection circuit enable signal VPEN (see (f) of FIG. 2) into a boosted voltage detection circuit 200 described later.

The source voltage drop detection signal VDOUT from the source voltage detection circuit 100 is inputted into one gate of an NAND circuit 400 while a read signal RD (see (c) of FIG. 2) for controlling the reading of data from the memory cell 4 is inputted into the other gate of the NAND circuit 400.

The boosted voltage detection circuit 200 is operable to detect the boosted voltage VPP generated by the booster circuit 300 boosting the source voltage VCC, and is enabled when the boosted voltage detection circuit enable signal VPEN (see (f) of FIG. 2) is in "H" level. More specifically, the boosted voltage detection circuit 200 outputs a boosted voltage detection signal VPOUT of "L" level indicated by (g) of FIG. 2 until the boosted voltage VPP (see (j) of FIG. 2) initiated by the booster circuit 300 reaches a first boosted voltage threshold value V3 or until the boosted voltage VPP reaches the first boosted voltage threshold value V3 from a second boosted voltage threshold value V4, where V4<V3.

On the other hand, the boosted voltage detection circuit 200 outputs a boosted voltage detection signal VPOUT of "H" level indicated by (g) of FIG. 2 while the boosted voltage VPP takes a value ranging from the first boosted voltage threshold value V3 to the second boosted voltage threshold value V4. Therefore, the boosted voltage detection circuit 200 outputs the compared result between the boosted voltage VPP and the first boosted voltage threshold value V3 (the second boosted voltage threshold value V4) as the boosted voltage detection signal VPOUT.

Here, the first boosted voltage threshold value V3 described in the above is a value taking the maximum value of the source voltage VCC as the upper limit, and the second boosted voltage threshold value V4 is a value (3.0 V in this example) two times greater than the threshold value (1.5 V in this example) of the selective transistor 5. This is because the sufficient gate voltage of the selective transistor 5 is required to turn on the selective transistor 5 even when the source voltage VCC decreases. It is to be noted that the first boosted voltage threshold value V3 indicated by (j) of FIG. 2 is set to a value ranging from the second boosted voltage threshold value V4 or more up to the maximum value of the source voltage VCC.

The boosted voltage detection signal VPOUT from the boosted voltage detection circuit 200 is inputted into one gate of a NOR circuit 700, and an output signal of the NAND circuit 400 is inputted into the other gate of the NOR circuit 700. An output signal of the NOR circuit 700 is inputted into one gate of a NOR circuit 1000. Into the other gate of the NOR circuit 1000 is inputted a write booster circuit enable signal CPEN (see (d) of FIG. 2) for activating the booster circuit 300 when the data is written to the memory cell 4. The write booster circuit enable signal CPEN is a signal of "H" level when the data is written and also a signal of "L" level when the data is read.

An output signal of the NOR circuit 1000 is inverted by an inverter 1100, and is then inputted into the booster circuit 300 as a booster circuit enable signal BSTEN (see (i) of FIG. 2) for controlling the operation of the booster circuit 300. A NAND circuit 900 is inputted with an output signal of the NAND circuit 400 into one gate thereof and is inputted with a signal obtained by an inverter 800 inverting the above-stated write booster circuit enable signal CPEN into the other gate thereof. An output signal of the NAND circuit 900 is inputted into the booster circuit 300 as a discharge control signal DCHGX indicated by (h) of FIG. 2.

The booster circuit 300 is an existing circuit for applying a high voltage (for example, 20 V) to the word line WL when the data is written to the memory cell 4, and this circuit may also be used for reading in one embodiment of the present invention. In other words, the booster circuit 300 boosts the source voltage VCC to generate the boosted voltage VPP, which is then applied to the word line WL via a high-voltage switch 1200 when the discharge control signal DCHGX (see (h) of FIG. 2) and the booster circuit enable signal BSTEN (see (i) of FIG. 2) are both in "H" level during read. The high-voltage switch 1200 is a switching element for applying a high voltage to the word line WL when the data is written to the memory cell 4, like the booster circuit 300. The booster circuit 300 also supplies the boosted voltage VPP to the boosted voltage detection circuit 200.

In this structure, as described above, the memory transistor 6 is charged with electric charge when "0" data is written to the memory cell 4. In this state, when the "0" data stored in the memory cell 4 is read, at time t1 shown in FIG. 2, the enable signal VDEN (see (b) of FIG. 2) and the read signal RD (see (c) of FIG. 2) are both in "H" level and the write booster circuit enable signal CPEN (see (d) of FIG. 2) is still in "L" level.

Since the source voltage VCC is higher than the low voltage threshold value V1 at time t1 as indicated by (a) of FIG. 2, the source voltage drop detection signal VDOUT (see (e) of FIG. 2) is in "L" level. It is assumed in this state that the source voltage VCC (see (a) of FIG. 2) gradually decreases as indicated by (a) of FIG. 2 to the low voltage threshold value V1 or less at time t2. This state is detected by the source voltage detection circuit 100 to turn the source voltage drop detection signal VDOUT (see (e) of FIG. 2) from "L" level to "H" level.

Therefore, the boosted voltage detection circuit enable signal VPEN (see (f) of FIG. 2) that is inputted into the boosted voltage detection circuit 200 is turned from "L" level to "H" level. Now, the boosted voltage detection circuit VPOUT (see (g) of FIG. 2) is still in "L" level since the booster circuit 300 has not yet boosted the source voltage VCC.

Further, the discharge control signal DCHGX (see (h) of FIG. 2) and the booster circuit enable signal BSTEN (see (i) of FIG. 2) are both turned from "L" level to "H" level at time t2. Then, the booster circuit 300 initiates to boost the decreased source voltage VCC accordingly as indicated by (j) of FIG. 2. The boosted voltage VPP caused by boosting the source voltage VCC is applied to the word line WL via the high-voltage switch 1200 and is also supplied to the boosted voltage detection circuit 200. This results in increased potential of the word line WL.

If the boosted voltage VPP indicated by (j) of FIG. 2 is equal to or more than the first boosted voltage threshold value V3 at time t3, the boosted voltage detection signal VPOUT (see (g) of FIG. 2) from the boosted voltage detection circuit 200 is turned from "L" level to "H" level while the booster circuit enable signal BSTEN (see (i) of FIG. 2) is turned from "H" level to "L" level. In response to this, the boosting operation by the booster circuit 300 is stopped. As a result, the boosted voltage VPP gradually decreases after time t3 as indicated by (j) of FIG. 2.

When the word line WL is selected in this state, a voltage is applied to the gate of the selective transistor 5. The gate voltage at this time is sufficiently high relative to the threshold voltage of the selective transistor 5 since the boosted voltage VPP, or a high voltage, has been applied to the word line WL. Therefore, in this case, the selective transistor 5 is turned on in a normal manner although the source voltage VCC decreases. Now, the memory transistor 6 is turned on due to the charged electric charge, thus making a current flow to the bit line BL, and the current is detected to read the "0" data.

If the boosted voltage VPP indicated by (j) of FIG. 2 is lower than the second boosted voltage threshold value V4 at time t4, the boosted voltage detection signal VPOUT (see (g) of FIG. 2) is turned from "H" level to "L" level while the booster circuit enable signal BSTEN (see (i) of FIG. 2) is turned from "L" level to "H" level.

In response to this, the booster circuit 300 once again boosts the source voltage VCC until the boosted voltage VPP returns to the first boosted voltage threshold value V3 as indicated by (j) of FIG. 2, and then outputs the resultant voltage as the boosted voltage VPP. Afterward, the foregoing operation is repeated in the booster circuit 300 to maintain the boosted voltage VPP ranging from the second boosted voltage threshold V4 to the first boosted voltage threshold value V3.

If the source voltage VCC increases to become the low voltage threshold value V2 or more at time t5, the source voltage drop detection signal VDOUT (see (e) of FIG. 2) is turned from "H" level to "L" level in the source voltage detection circuit 100. As these level changes, the boosted voltage detection circuit enable signal VPEN in the booster voltage detection circuit 200 (see (f) of FIG. 2) is turned from "H" level to "L" level accordingly.

In response to this, the discharge control signal DCHGX (see (h) of FIG. 2) in the booster circuit 300 is turned from "H" level to "L" level while the booster circuit enable signal BSTEN (see (i) of FIG. 2) is in "L" level. Therefore, the booster circuit 300 is disenabled, thus stopping the boosting operation.

As described above, the memory circuit according to the present embodiment is such that the boosted voltage VPP generated from the booster circuit 300 is applied to the word line WL when the data is read from the memory cell 4 and when the source voltage VCC is dropped to the low voltage threshold value V1 or less. This results in the gate voltage sufficiently high relative to the threshold voltage of the selective transistor 5 when the word line WL is selected.

Therefore, in the memory circuit according to the present embodiment, the selective transistor 5 can be turned on in a normal manner when the data is read even when the source voltage VCC decreases, thus making it possible to read the data in a normal manner.

Further, the memory circuit according to the present embodiment employs an intermittent driving control in which the boosted voltage VPP is detected by the boosted voltage detection circuit 200, according to which the booster circuit 300 is stopped when the boosted voltage VPP is a value sufficient for the switching operation in the selective transistor 5. This can reduce the power consumption.

Still further, the memory circuit according to the present embodiment employs the existing booster circuit 300 and the high-voltage switch 1200, thus making it possible to achieve relatively easy circuit structure.

While the memory circuit according to an embodiment of the present invention has been described in detail, the structure embodying the present invention is not to be limited to this embodiment, and the present invention may embrace any variation or modification in design without departing from the gist of the invention. For example, in the memory circuit according to the present embodiment, the source voltage detection circuit 100 and the boosted voltage detection circuit 200 shown in FIG. 1 may not be limited in view of the design so long as these circuits have any circuit structure embodying the foregoing features.

Figure 3:
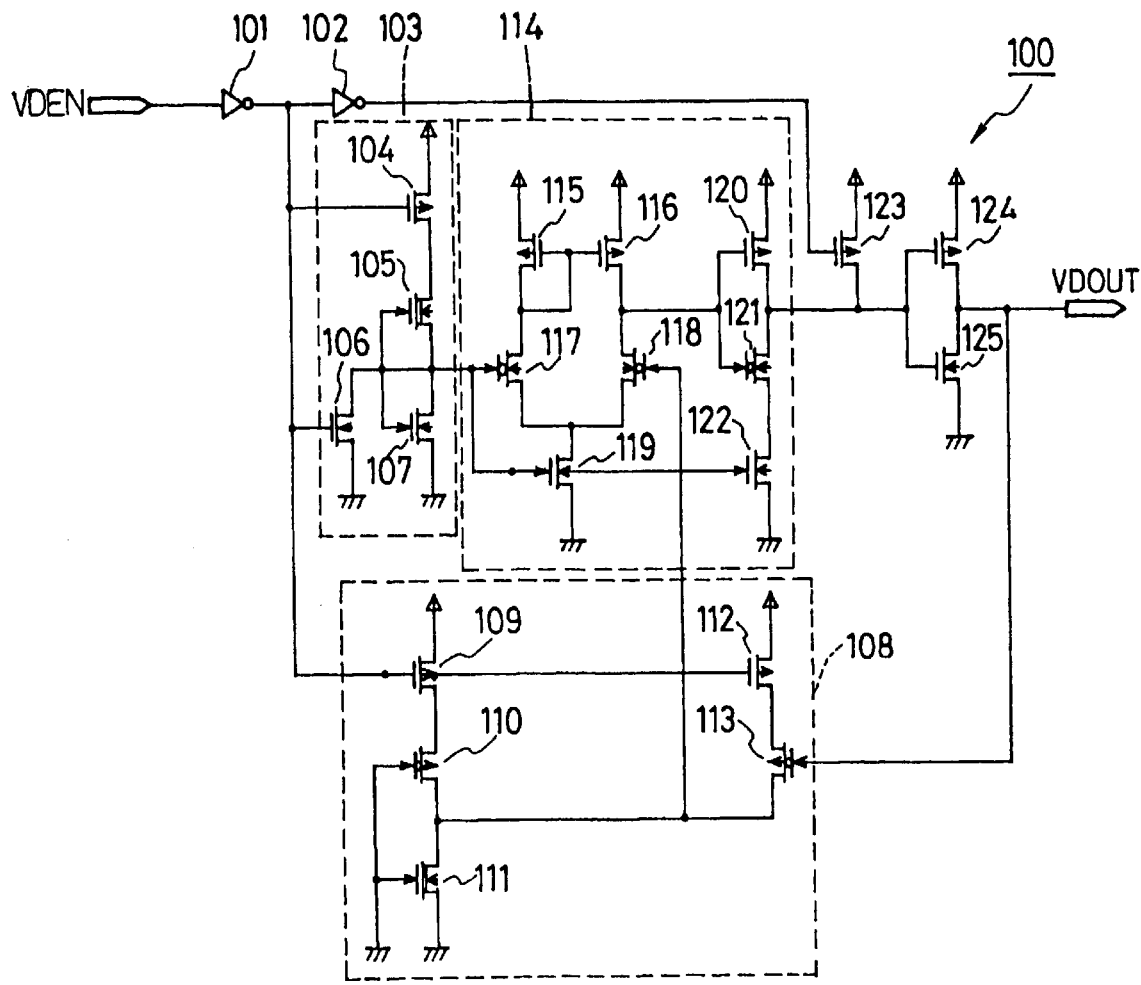
FIG. 3 is a circuit diagram showing an example of a source voltage detection circuit 100 in the memory circuit in accordance with the same embodiment of the present invention.
Figure 4:
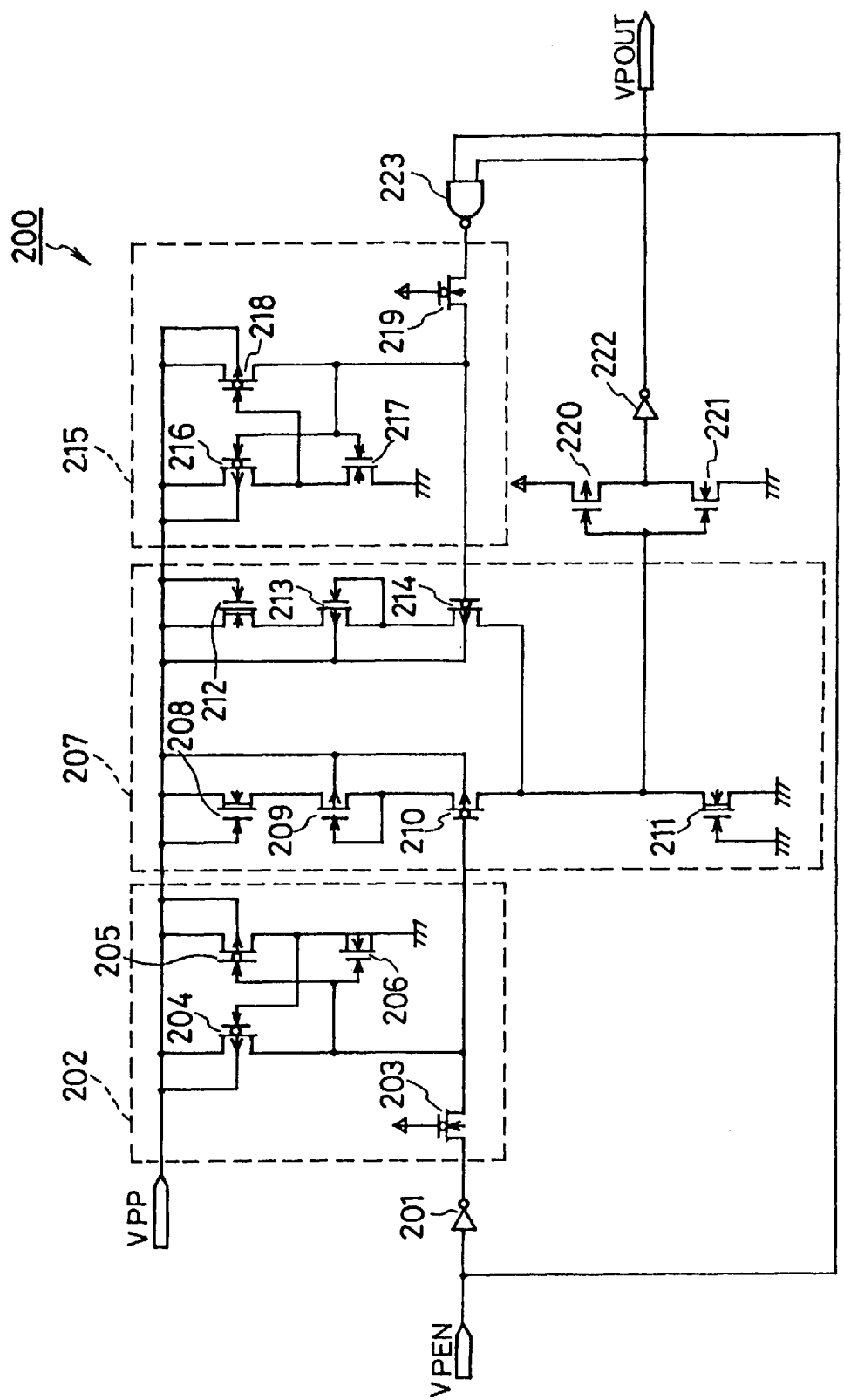
FIG. 4 is a circuit diagram showing an example of a boosted voltage detection circuit 200 in the memory circuit in accordance with the same embodiment of the present invention.

The circuit layouts of the source voltage detection circuit 100 and the boosted voltage detection circuit 200 are shown in FIGS. 3 and 4, respectively. Needless to say, the circuit layouts shown in FIGS. 3 and 4 are examples, and the present invention is not to be limited thereto. The source voltage detection circuit 100 shown in FIG. 3 comprises an inverter 101 into which the enable signal VDEN (see (b) of FIG. 2) is to be inputted, an inverter 102, a constant voltage circuit 103, a constant voltage circuit 108, a differential amplifier circuit 114, an enhancement type PMOS (Metal Oxide Semiconductor) transistor 123, an enhancement type PMOS transistor 124 and an enhancement type NMOS transistor 125.

The constant voltage circuit 103 is operable to generate a reference voltage, comprising an enhancement type PMOS transistor 104, a depletion type NMOS transistor 105, an enhancement type NMOS transistor 106 and an enhancement type NMOS transistor 107.

The constant voltage circuit 108 is responsive to the feedback of the source voltage drop detection signal VDOUT to generate the source voltage VCC (see (a) of FIG. 2) as a reference voltage, comprising an enhancement type PMOS transistor 109, an intrinsic type PMOS transistor 110, a depletion type NMOS transistor 111, an enhancement type PMOS transistor 112 and an intrinsic type PMOS transistor 113. It is to be noted that the intrinsic type PMOS transistor 110 is a transistor having a threshold voltage of 1.7 V, for example.

The differential amplifier circuit 114 is operable to amplify deferential between an output voltage of the constant voltage circuit 103 and an output voltage of the constant voltage circuit 108, comprising an enhancement type PMOS transistor 115, an enhancement type PMOS transistor 116, an intrinsic type NMOS transistor 117, an intrinsic type NMOS transistor 118 and an enhancement type NMOS transistor 119, constituting a current mirror. It is to be noted that the intrinsic type NMOS transistor 117 is a transistor having a threshold voltage of 0 V. The differential amplifier circuit 114 also comprises an enhancement type PMOS transistor 120, an intrinsic type NMOS transistor 121 and an enhancement type NMOS transistor 122.

In contrast, the boosted voltage detection circuit 200 shown in FIG. 4 comprises an inverter 201 into which the boosted voltage detection circuit enable signal VPEN (see (f) of FIG. 2) is to be inputted, a level shifter 202, a constant voltage circuit 207, a level shifter 215, an enhancement type PMOS transistor 220, an enhancement type NMOS transistor 221 and an inverter 222 and an NAND circuit 223.

The level shifters 202, 215 are operable to level convert from the source voltage VCC (see (a) of FIG. 2) to the boosted voltage VPP (see (j) of FIG. 2). The level shifter 202 comprises an intrinsic type NMOS transistor 203 the gate of which the source voltage VCC is applied to, an intrinsic type PMOS transistor 204, an intrinsic type PMOS transistor 205 and an enhancement type NMOS transistor 206.

On the other hand, the level shifter 215 comprises an intrinsic type PMOS transistor 216, an enhancement type NMOS transistor 217, an intrinsic type PMOS transistor 218, and an intrinsic type NMOS transistor 219 the gate of which the source voltage VCC is applied to.

The constant voltage circuit 207 is operable to generate the boosted voltage VPP as a reference voltage, comprising a depletion type NMOS transistor 208, an enhancement type PMOS transistor 209 and an intrinsic type PMOS transistor 210. The constant voltage circuit 207 also comprises a depletion type NMOS transistor 211, a depletion type NMOS transistor 212, an enhancement type PMOS transistor 213 and an intrinsic type PMOS transistor 214.

There is no reference to memory types in the memory circuit according to the present embodiment, but memories embodying the same include an EEPROM (Electrically Erasable and Programmable Read Only Memory) and a flash memory.

As described above, according to the present invention, when the source voltage is equal to or less than the low voltage threshold value during read, the booster means boosts the source voltage to apply the boosted voltage to the word line. Therefore, the gate voltage of the selective transistor is sufficiently high relative to the threshold value of the selective transistor when the word line is selected. Therefore, according to the present invention, the selective transistor may not be influenced from a drop of the source voltage and is turned on in a normal manner during read, thus attaining an effect in that the "1"/"0" data can be read even in a normal manner when the source voltage decreases.

Further, the memory circuit according to the present invention comprises booster voltage detection means for detecting a boosted voltage, employing an intermittent driving control in which the boosting operation is performed by the booster means if the boosted voltage is less than the lower limit of the range (i.e., over two times greater than the threshold voltage of the selective transistor) while the boosting operation is stopped if the boosted voltage is over the upper limit of the range (i.e., less than the maximum value of source voltage). This attains an effect in that any excess boosting operation can be prevented, thereby reducing the power consumption.

Still further, the memory circuit according to the present invention causes a high voltage when the data is written to the memory cell, and employs the features (high voltage generating feature) of a conventional write booster means, thus attaining an effect in that relatively easy circuit structure can be achieved.

What is claimed is:

1. A memory circuit comprising: a memory cell provided at a cross point of a word line and a bit line and having a selective transistor that is turned on when the word line is selected, and a memory transistor connected to the selective transistor for storing data according to the presence/absence of electric charge; source voltage detection means for detecting a source voltage; and booster means responsive to the detection result of the source voltage detection means for boosting the source voltage if the source voltage becomes about equal to or less than a threshold value of the selective transistor when the data is being read out and applying the boosted voltage to the word line.

2. A memory circuit according to claim 1; wherein the booster means boosts the source voltage to a boosted voltage having a value ranging from two or more times greater than the threshold voltage of the selective transistor up to the maximum value of the source voltage.

3. A memory circuit according to claim 2; further comprising boosted voltage detection means for detecting the boosted voltage; wherein said booster means is responsive to the detection result of the boosted voltage detection means to boost the source voltage so that the boosted voltage has a value in the range from two or more times greater than the threshold voltage of the selective transistor up to the maximum value of the source voltage.

4. A memory circuit according to any one of claims 1 to 3; wherein the booster means produces a high voltage when data is being written to the memory cell.

5. A memory circuit comprising: a memory cell; a power source for supplying a source voltage to the memory cell; a voltage detecting circuit for detecting the source voltage;

and a boosting circuit connected to an output of the power source and the voltage detecting circuit for boosting the source voltage if the source voltage becomes near to or less than a threshold value of a selecting transistor of the memory cell when data is to be read out from the memory cell.

6. A memory circuit according to claim 5; wherein the memory cell comprises a word line, a bit line, a memory transistor for storing a charge, and a selecting transistor connected in series to the memory transistor and having a gate electrode connected to the word line and one of a source electrode and a drain electrode connected to the bit line.

7. A memory circuit according to claim 6; wherein the selecting transistor and the memory transistor are connected in series between the power source and a ground terminal.

8. A memory circuit according to claim 6; wherein the boosting circuit inputs a detection result of the voltage detecting circuit, boosts the power source voltage when the power source voltage is equal to or less than a threshold voltage of the selecting transistor, and applies the boosted voltage to the word line when data is to be read out from the memory transistor.

9. A memory circuit according to claim 8; wherein the boosting circuit boosts the power source voltage to a level within the range from at least twice the threshold voltage of the selecting transistor to a maximum voltage level of the power source voltage.

10. A memory circuit according to claim 5; further comprising a high voltage switch interposed between the gate of the selecting transistor and the boosting circuit.

11. A memory circuit according to claim 5; further comprising a boosted voltage detecting circuit connected to an output of the boosting circuit.

12. A memory circuit according to claim 11; wherein the boosted voltage detecting circuit detects the boosted voltage output by the boosting circuit, and an output of the boosted voltage detection circuit is fed back to the boosting circuit to control the boosting circuit to boost the power source voltage to a level within a range from at least twice the threshold voltage of the selecting transistor to a maximum value of the power source voltage.

13. A memory circuit according to claim 5; wherein the boosting circuit boosts the power source voltage when data is to be written to the memory cell.

14. A memory circuit comprising: a memory cell having a selecting transistor, and a memory transistor connected in series to the selecting transistor; a power source for supplying a power source voltage to the memory cell; a voltage detecting circuit for detecting the power source voltage and outputting a detection signal; and a boosting circuit for boosting the power source voltage to produce a boosted voltage when the detection signal indicates that the power source voltage has fallen to a value near or below a threshold voltage of the selecting transistor when data is to be read out from the memory transistor, the boosted voltage having a value in the range of twice the threshold voltage of the selecting transistor to a maximum power source voltage level.

15. A memory circuit according to claim 14; wherein the memory cell further comprises a word line connected to a gate electrode of the selecting transistor, and a bit line connected to one of a source electrode and a drain electrode of the selecting transistor.

16. A memory circuit according to claim 15; further comprising a high voltage switch interposed between the gate of the selecting transistor and the output of the boosting circuit.

17. A memory circuit according to claim 14; further comprising a boosted voltage detecting circuit for detecting the boosted voltage and outputting a detection result to the boosting circuit to boost the power source voltage to a level within the range from at least twice the threshold voltage of the selecting transistor to a maximum value of the power source voltage.

18. A memory circuit according to claim 14; wherein the boosting circuit produces a boosted voltage when data is written to the memory cell.

19. A memory circuit comprising: a memory cell having a selecting transistor, and a memory transistor connected in series to the selecting transistor; a power source for supplying a power source voltage to the memory cell; a voltage detecting circuit for detecting a voltage of the power source and outputting a detection signal; a boosting circuit for boosting the power source voltage to produce a boosted voltage when the detection signal indicates that the source voltage has fallen to a value near or below a threshold voltage of the selecting transistor; and a boosted voltage detecting circuit for detecting the boosted voltage and controlling the boosting circuit to boost the power source voltage to a value within a predetermined range having a lower limit that is greater than a threshold voltage of the selecting transistor.

20. A memory circuit according to claim 19; wherein the predetermined range is from a voltage larger than the threshold voltage of the selecting transistor to a maximum voltage level of the power source voltage.

21. A memory circuit according to claim 19; further comprising a high voltage switch interposed between the gate of the selecting transistor and the boosting circuit.

22. A memory circuit according to claim 19; wherein the predetermined value is a threshold voltage of the selecting transistor.

* * * * *